(12) United States Patent
Abe et al.

(10) Patent No.: US 6,400,251 B1
(45) Date of Patent: *Jun. 4, 2002

(54) CHIP THERMISTOR

(75) Inventors: Yoshiaki Abe; Takeo Haga, both of Shiga (JP)

(73) Assignee: Murata Manufacturing Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/518,497

(22) Filed: Mar. 3, 2000

(30) Foreign Application Priority Data

Apr. 1, 1999 (JP) .......................... 11-095002

(51) Int. Cl.$^7$ ................................. H01L 7/13
(52) U.S. Cl. ............... 338/22 R; 338/22 SD; 338/320; 338/328; 338/314; 338/332
(58) Field of Search ............ 338/22 R, 22 SD, 338/320, 332, 313, 314, 328

(56) References Cited

U.S. PATENT DOCUMENTS

| | | | | |
|---|---|---|---|---|
| 4,912,450 A | * | 3/1990 | Yoneda et al. ............. | 338/22 R |
| 4,992,771 A | * | 2/1991 | Caporali et al. .......... | 338/22 R |
| 5,166,658 A | * | 11/1992 | Fang et al. ............... | 338/23 |
| 5,488,348 A | * | 1/1996 | Asida et al. .............. | 338/22 R |
| 5,493,266 A | * | 2/1996 | Sasaki et al. ............. | 338/22 R |
| 6,040,755 A | * | 3/2000 | Abe et al. ................ | 338/22 R |

FOREIGN PATENT DOCUMENTS

| | | | |
|---|---|---|---|
| JP | 4-96301 | * 3/1992 | |
| JP | 4150001 | * 5/1992 | ............... 338/22 R |
| JP | 404320301 | * 11/1992 | ............. 338/22 SD |
| JP | 7-106054 | 4/1995 | |
| KR | 1998-703131 | 5/1998 | |

* cited by examiner

*Primary Examiner*—Karl D. Easthom
(74) *Attorney, Agent, or Firm*—Beyer Weaver & Thomas LLP

(57) ABSTRACT

A chip thermistor includes a layered structure having a thermistor element and a substrate stacked one above the other with an electrically insulating layer in between. The thermistor element has a pair of surface electrodes on surfaces of a planar thermistor body, and a pair of outer electrodes each on a corresponding one of mutually opposite end parts of this layered structure. Each of these outer electrodes is electrically connected to a corresponding one of the surface electrodes. The pair of surface electrodes is preferably each formed so as to cover a major portion of one of the main surfaces of the thermistor body and to reach the opposite main surface through one of its side surfaces, while in a mutually separated and electrically insulated relationship. The substrate may preferably be another thermistor body.

12 Claims, 1 Drawing Sheet

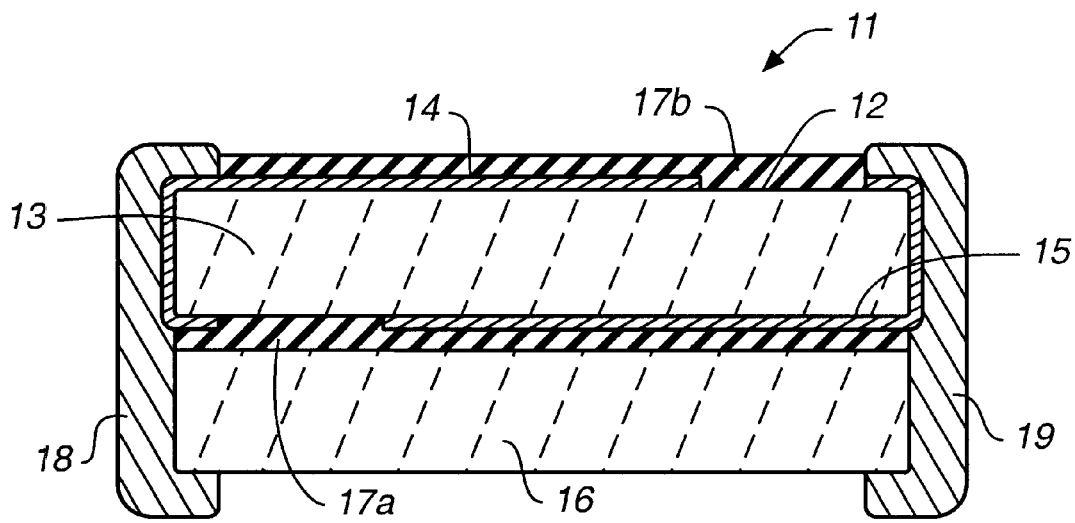
FIG._1
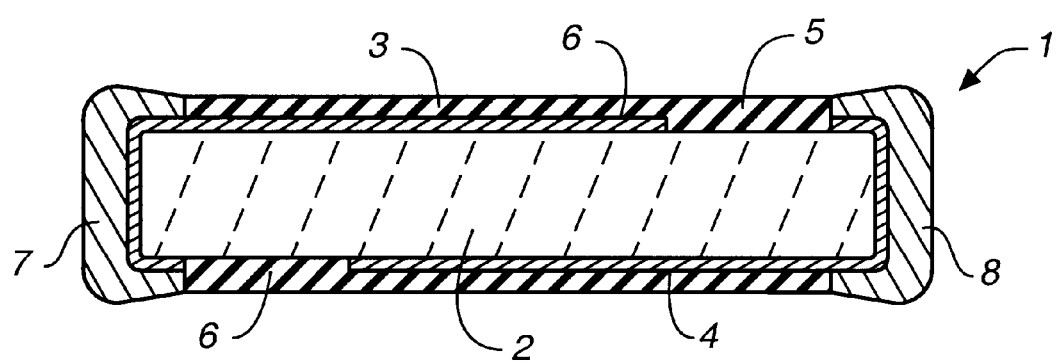
FIG._2
*(PRIOR ART)*

CHIP THERMISTOR

BACKGROUND OF THE INVENTION

This invention relates to a chip-type thermistor ("chip thermistor") which may be used for protection against an overcurrent.

Chip thermistors include both positive resistance-temperature coefficient (PTC) thermistors and negative resistance-temperature coefficient (NTC) thermistors. A PTC chip thermistor may be incorporated into the circuit of an electronic device so as to generate heat when an overcurrent with intensity greater than a specified level flows therethrough, thereby increasing its resistance due to its positive resistance-temperature characteristic and keeping the intensity of the current flowing into the electronic device below a certain level.

FIG. 2 shows a prior art PTC thermistor 1 comprising a thermistor element 5 having surface electrodes 3 and 4 formed on a planar PTC thermistor body 2, electrically insulating layers 6 formed on both main surfaces of the PTC thermistor element 5 so as to cover the surface electrodes 3 and 4, and outer electrodes 7 and 8 formed on both end surfaces of the PTC thermistor element 5 so as to be electrically connected to the surface electrodes 3 and 4.

The PTC thermistor 1, when used for protection against an overcurrent, for example, is required to have a low resistance value in order to reduce the power loss associated with a voltage drop. In general, however, the heat production from a PTC thermistor element increases if the resistance of its ceramic material is reduced. Since the insulating layer 6 of the PTC thermistor 1 is very thin, the heat from the PTC thermistor element 5 travels easily to the circuit board onto which the PTC thermistor 1 is mounted, having ill effects not only on the circuit board itself but also on peripheral devices near by.

SUMMARY OF THE INVENTION

It is therefore an object of this invention in view of these problems to provide an improved chip thermistor capable of reducing the rise in the temperature of the circuit board onto which it is mounted.

It is another object of this invention to provide such a chip thermistor capable of maintaining the strength of its planar thermistor element even if it is made thin in order to reduce its resistance.

A chip thermistor embodying this invention, with which the above and other objects can be accomplished, may be characterized as comprising a layered structure having a thermistor element and a substrate stacked one above the other with an electrically insulating layer in between, the thermistor element having a pair of surface electrodes on surfaces of a planar thermistor body, and a pair of outer electrodes each on a corresponding one of mutually opposite end parts of this layered structure, each of these outer electrodes being electrically connected to a corresponding one of the surface electrodes. The pair of surface electrodes is preferably each formed so as to cover a major portion of one of the main surfaces of the thermistor body and to reach the opposite main surface through one of its side surfaces, while in a mutually electrically insulated relationship. The substrate may preferably comprise another thermistor body.

With an electrically insulating plate thus attached to the surface of the thermistor element facing a circuit board onto which it is to be mounted, the heat generated by the thermistor element is more effectively inhibited from being conducted to the circuit board.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a sectional view of a PTC chip thermistor embodying this invention; and FIG. 2 is. a sectional view of a prior art PTC chip thermistor.

DETAILED DESCRIPTION OF THE INVENTION

The invention is described next by way of an example. FIG. 1 shows a PTC chip thermistor 11 embodying this invention, comprising a layered a single PTC thermistor element 12 and a single substrate 16 stacked one above the other with an insulating layer 17a formed in between to separate them one from the other. The layered structure has a pair of mutually opposite side surfaces and outer electrodes 18 and 19 are formed so as to each completely cover a corresponding one of these side surfaces. PTC thermistor element 12 is one obtained by forming by a method of thin-film technology a pair of surface electrodes 14 and 15 each comprising three layers respectively of Cr, monel and Ag on surfaces of a PTC thermistor body 13 which is planar and of dimensions 4.5 mm ×3.2 mm ×0.2 mm. It is preferable that each angular edge between a main surface and a side surface be rounded off such that the surface electrodes 14 and can be of a uniform thickness where they attach themselves to the PTC thermistor body 13 over each edge and that there will be no discontinuity in the surface electrodes 14 and 15 causing an occurrence of incomplete conduction.

As shown in FIG. 1, one of the surface electrodes ("first surface electrode" 14) covers a major portion of one of the main surfaces ("first main surface") of the PTC thermistor body 13 and passes over one of its side surfaces to cover a small portion of its other main surface ("second main surface"), and the other of the surface electrodes ("second surface electrode" 15) covers a major portion of its second main surface and passes over another of its side surfaces to cover a small portion of its first main surface such that the two surface electrodes 14 and 15 are in a mutually separated and insulated relationship. Since each of these surface electrodes 14 and 15 is thus formed over both main surfaces and one of the side surfaces of the PTC thermistor body 13, they each make a dependable contact with a corresponding one of the outer electrodes 18 and 19 on the both end surfaces of the PTC thermistor element 12 and are dependably insulated from the other one of the outer electrodes 18 and 19 although these outer electrodes 18 and 19 are formed so as to cover small portions of the main surfaces.

The material of which the surface electrodes 14 and 15 may be comprised of does not limit the scope of the invention as long as they have a metallic base layer capable of forming an ohmic contact. This need not be Cr and may be Ni or Al, for example. Neither is the method of their formation intended to limit the scope of the invention. They may be formed by sputtering, by vapor deposition, or by printing and baking an electrically conductive paste. They may be of a layered structure with several layers.

Electrically insulating layers 17a and 17b are formed all over on respective one of the main surfaces of the PTC thermistor element 12 by applying a paste of lead boro-silicate glass to a thickness of about 80 μm and baking. The substrate 16 (which is essentially another PTC thermistor body without any surface electrode formed thereon) is pasted to the PTC thermistor element 12 with the insulating layer 17a in between. This is effected by superposing the substrate 16 (that is, a PTC thermistor body without electrode thereon) on one of the main surfaces of the PTC thermistor element 12 coated with a glass paste and then subjecting it to a baking process. Alternatively, a glass paste may be preliminarily applied entirely over one of the main surfaces of the substrate 16 before superposing it on top of the PTC thermistor element 12, the glass paste being thereafter subjected to a baking process.

In addition to the insulating layers 17a and 17b shown in FIG. 1, other insulating layers may also be formed, say, on the remaining side surfaces of the PTC thermistor element 12 (towards and/or away from the viewer) except where the outer electrodes 18 and 19 are to be formed. If this is done, all four surfaces of the PTC thermistor element 12 except the end surfaces are completely covered with glass which is electrically insulating.

The use of lead boro-silicate glass is not intended to limit the scope of the invention. Glass materials of other kinds, as well as resin materials, may be used as insulator.

The outer electrodes 18 and 19 may be formed by applying an Ag paste on both end surfaces of the layered structure with the PTC thermistor element 12 and the substrate 16 stacked one on top of the other to a thickness of about 6 μm and baking it at 500° C. for 10 minutes and are electrically connected individually to the surface electrodes 14 and 15 on the PTC thermistor element 12. These outer electrodes 18 and 19 are required only to comprise a metallic material with a good soldering characteristic. They may be formed by providing an upper-layer film (say, of Sn) with a good soldering characteristic over a baked Ag layer. These layers may also be formed by sputtering, by vapor deposition, by printing and baking an electrically conductive paste, or by soldering. They may be of a layered structure with several layers.

The PTC chip thermistor 11 thus structured is advantageous because, when it is mounted to a circuit board, the substrate 16 (which is a PTC thermistor body) attached to the circuit board serves to inhibit the conduction of heat generated by the PTC thermistor element 12 to the circuit board such that the unwanted rise in temperature of the circuit board can be prevented. Experiments were carried out by mounting samples of both PTC chip thermistors embodying this invention and prior art thermistors on a circuit board, applying a voltage to each and measuring the surface temperatures of the circuit board onto which they were mounted. With five samples of prior art thermistors, the measured surface temperatures of the circuit board were 130° C., 129° C., 125° C., 132° C. and 126° C., the average temperature being 128° C. With five samples according to this invention, the measured surface temperatures were 100° C., 99° C., 102° C., 95° C. and 100° C., the average temperature being 99° C. Thus, the difference between the average temperatures was as large as nearly 30° C. between the samples of prior art thermistors and the thermistors embodying this invention. This experimental result clearly proves that a PTC chip thermistor according to this invention is capable of preventing the rise in the temperature of the circuit board on which it is mounted.

It now goes without saying that many modifications and variations are possible within the scope of this invention. For example, another substrate 16 may be attached to the top main surface of the PTC thermistor element 12 through a glass paste such that the PTC thermistor element 12 is sandwiched between two substrates 16. Although a PTC thermistor body (without electrodes formed thereon) was used as substrate in the example described above, what was referred to above as the substrate may be substituted by any insulator such as alumina such that a resistance greater than $10^6$ Ω can be maintained between the outer electrodes 18 and 19.

The invention is also applicable for the production of a negative resistance-temperature coefficient (NTC) thermistor.

What is claimed is:

1. A chip thermistor consisting of:

a single thermistor element and a single substrate stacked one above the other;

an electrically insulating layer formed between said thermistor element and said substrate, contacting and separating one from the other said thermistor element and said substrate, said thermistor element, said substrate and said insulating layer together forming a layered structure having. mutually opposite end surfaces, said thermistor element having a pair of surface electrodes on surfaces of a planar thermistor body;

an electrically insulating surface layer on said thermistor element opposite said substrate; and a pair of outer electrodes each completely covering a corresponding one of said end surfaces of said layered structure, each of said outer electrodes being electrically connected to a corresponding one of said surface electrodes.

2. The chip thermistor of claim 1 wherein said planar thermistor body has a first main surface and a second main surface which are opposite each other and side surfaces between said first main surface and said second main surface, wherein said pair of surface electrodes consists of a first surface electrode and a second surface electrode which are in a mutually physically separated relationship, said first surface electrode being over a major portion of said first main surface and reaching a portion of said second main surface through one of said side surfaces, and said second surface electrode being over a major portion of said second main surface and reaching a portion of said first main surface through another of said side surfaces.

3. The chip thermistor of claim 1 wherein said substrate comprises an electrically insulating material.

4. The chip thermistor of claim 3 where said substrate comprises alumina.

5. The chip thermistor of claim 3 where said substrate comprises a thermistor material.

6. The chip thermistor of claim 1 wherein said thermistor body is a PTC thermistor body.

7. The chip thermistor of claim 2 wherein said thermistor body is a PTC thermistor body.

8. The chip thermistor of claim 2 wherein said substrate comprises an electrically insulating material.

9. The chip thermistor of claim 8 where said substrate comprises alumina.

10. The chip thermistor of claim 8 where said substrate comprises a thermistor material.

11. The chip thermistor of claim 1 wherein said layered structure has a top surface and a bottom surface which are opposite each other and extend between said end surfaces and wherein said outer electrodes extend from said end surfaces and also cover portions of said top surface and said bottom surface.

12. The chip thermistor of claim 2 wherein said layered structure has a top surface and a bottom surface which are opposite each other and extend between said end surfaces and wherein said outer electrodes extend from said end surfaces and also cover portions of said top surface and said bottom surface.

\* \* \* \* \*